US009069574B2

(12) United States Patent
Greiner et al.

(10) Patent No.: US 9,069,574 B2
(45) Date of Patent: *Jun. 30, 2015

(54) CODE ANALYSIS FOR SIMULATION EFFICIENCY IMPROVEMENT

(71) Applicant: International Business Machines Corporation, Armonk, NY (US)

(72) Inventors: Carsten Greiner, Holzgerlingen (DE); Joerg Kayser, Waldenbuch (DE); Roopesh A. Matayambath, Bangalore (IN); Juergen M. Ruf, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/102,551

(22) Filed: Dec. 11, 2013

(65) Prior Publication Data

US 2014/0250429 A1     Sep. 4, 2014

Related U.S. Application Data

(63) Continuation of application No. 13/782,119, filed on Mar. 1, 2013.

(51) Int. Cl.
| | | |
|---|---|---|
| G06F 9/45 | (2006.01) | |
| G06F 9/54 | (2006.01) | |
| G06F 17/50 | (2006.01) | |
| G06F 11/36 | (2006.01) | |

(52) U.S. Cl.
CPC .......... *G06F 8/4441* (2013.01); *G06F 11/3688* (2013.01); *G06F 17/5022* (2013.01); *G06F 9/54* (2013.01)

(58) Field of Classification Search
CPC ..................................................... G06F 8/4441
USPC ................................................. 717/144, 152
See application file for complete search history.

(56) References Cited

U.S. PATENT DOCUMENTS

| | | | |
|---|---|---|---|
| 7,447,621 | B1 | 11/2008 | Lam et al. |
| 7,549,144 | B2 | 6/2009 | Jubran |
| 8,156,457 | B2 | 4/2012 | Basile et al. |
| 8,209,646 | B2 | 6/2012 | Chess et al. |
| 2007/0174830 | A1* | 7/2007 | Gan et al. ....................... 717/153 |
| 2009/0024381 | A1* | 1/2009 | Sakamoto et al. .............. 703/26 |

(Continued)

OTHER PUBLICATIONS

Hayde, R., "Write Great Code, vol. 2: Thinking Low-Level, Writing High-Level" (2006), No Starch Press, Inc., pp. 385-437.*

(Continued)

*Primary Examiner* — Brian W Wathen
(74) *Attorney, Agent, or Firm* — Edward P. Li (57) ABSTRACT

A computer program product and computer system for analyzing code to improve efficiency of simulating a hardware system. A computer identifies one or more functions calling an application programming interface of a hardware simulator simulating the hardware system. In response to determining that left hand sides of respective one or more Boolean expressions are associated with the one or more functions calling the application programming interface and right hand sides are not associated with the one or more functions calling the application programming interface, the computer identifies the respective one or more Boolean expressions as one or more improvement points in source code for verifying a hardware model of the hardware system.

12 Claims, 9 Drawing Sheets

(56) References Cited

U.S. PATENT DOCUMENTS

| | | | |
|---|---|---|---|
| 2010/0023926 A1 | 1/2010 | Sugawara et al. | |
| 2011/0113405 A1 | 5/2011 | Guerrera et al. | |
| 2011/0296388 A1 | 12/2011 | Rohde et al. | |
| 2012/0117552 A1* | 5/2012 | Krishnaiyer et al. | 717/160 |
| 2012/0222021 A1* | 8/2012 | Zhao | 717/143 |
| 2012/0311546 A1* | 12/2012 | Fanning et al. | 717/136 |

OTHER PUBLICATIONS

Huang et al., "SoC HW/SW Verification and Validation" 16th Design Automation Conference (ASP-DAC), Jan. 25-28, 2011, pp. 297-300 [online], [retrieved on Oct. 24, 2012]. Retrieved from the Internet <URL: http://ieeexplore.ieee.org/xpl/articleDetails.jsp?tp=&arnumber=5722202&contentType=Conference+Publications&queryText%3Dspeed+up+simulation+of+HW+systems>.

Liu et al., "STAR: Generating input vectors for design validation by static analysis of RTL" High Level Design Validation and Test Workshop HLDVT, Nov. 4-6, 2009, pp. 32-37 [online], [retrieved on Oct. 24, 2012]. Retrieved from the Internet <URL: http://ieeexplore.ieee.org/xpl/articleDetails.jsp?tp=&arnumber=5340179&contentType=Conference+Publications&pageNumber%3D2%26queryText%3Dstatically+analyze+source+code>.

Pappas et al., "Build an Optimized Chip-Verification Environment for Hardware Simulation" Published in Oct./Nov. 2005 Issue of Chip Design Magazine [online], [retrieved on Oct. 24, 2012]. Retrieved from the Internet <URL:http://chipdesignmag.com/display.php?articleId=192&issueId=13>.

U.S. Appl. No. 13/782,119, entitled "Code Analysis for Simulation Efficiency Improvement", filed Mar. 1, 2013.

* cited by examiner

v = get32()

if ( get32() && c==1 ) ...

CODE ANALYSIS FOR SIMULATION EFFICIENCY IMPROVEMENT

CROSS REFERENCE TO RELATED APPLICATION

This application is a Continuation Application of pending U.S. patent application Ser. No. 13/782,119 filed on Mar. 1, 2013.

FIELD OF THE INVENTION

The present invention relates generally to simulation of computer hardware systems, and more particularly to code analysis for improving simulation efficiency.

BACKGROUND

Simulation of hardware models is a high performance application which has many long runs on a computer system or a computer cluster. Code execution time is critical to the high performance application. The simulation includes the time to simulate the hardware (i.e. hardware execution) and the time to drive and validate the hardware (i.e. simulation environment execution). Simulation environments are usually written in programming languages (e.g. C++). In the computer languages, known compiler optimization can be applied. Even though the simulation environments are optimized through the known compiler optimization, the simulation of hardware models wastes a lot of time in the simulation environments.

SUMMARY

Embodiments of the present invention provide a computer program product and computer system for analyzing code to improve efficiency of simulating a hardware system. A computer identifies one or more functions calling an application programming interface of a hardware simulator simulating the hardware system. The computer identifies respective one or more Boolean expressions as one or more improvement points in source code for verifying a hardware model of the hardware system, in response to determining that left hand sides of the respective one or more Boolean expression are associated with the one or more functions calling the application programming interface and in response to determining that right hand sides of the respective one or more Boolean expressions are not associated with the one or more functions calling the application programming interface.

BRIEF DESCRIPTION OF THE SEVERAL VIEWS OF THE DRAWINGS

FIG. 4-1 is a diagram showing an example of a function call graph, generated by the code analysis program shown in FIG. 2, in accordance with an exemplary embodiment of the present invention.

FIG. 4-2 is a diagram showing an example in which a middle layer API function calling simulator low level API function is tagged by the code analysis program shown in FIG. 2, in accordance with an exemplary embodiment of the present invention.

FIGS. 5-1(A), 5-2(A), and 5-3(A) are diagrams showing exemplary segments of abstract syntax trees for source code of the verification code shown in FIG. 1, in accordance with an exemplary embodiment of the present invention.

FIGS. 5-1(B), 5-2(B), and 5-3(B) are diagrams showing examples of identifying, in the exemplary segments of abstract syntax trees shown in FIGS. 5-1(A), 5-2(A), and 5-3(A), symbols associated with simulation middle layer functions calling simulator low level API functions, in accordance with an exemplary embodiment of the present invention.

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. The term of "computer readable storage medium" or "one or more computer-readable tangible storage devices", as used in this document, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In this document, API stands for Application Programming Interface.

Figure 1:
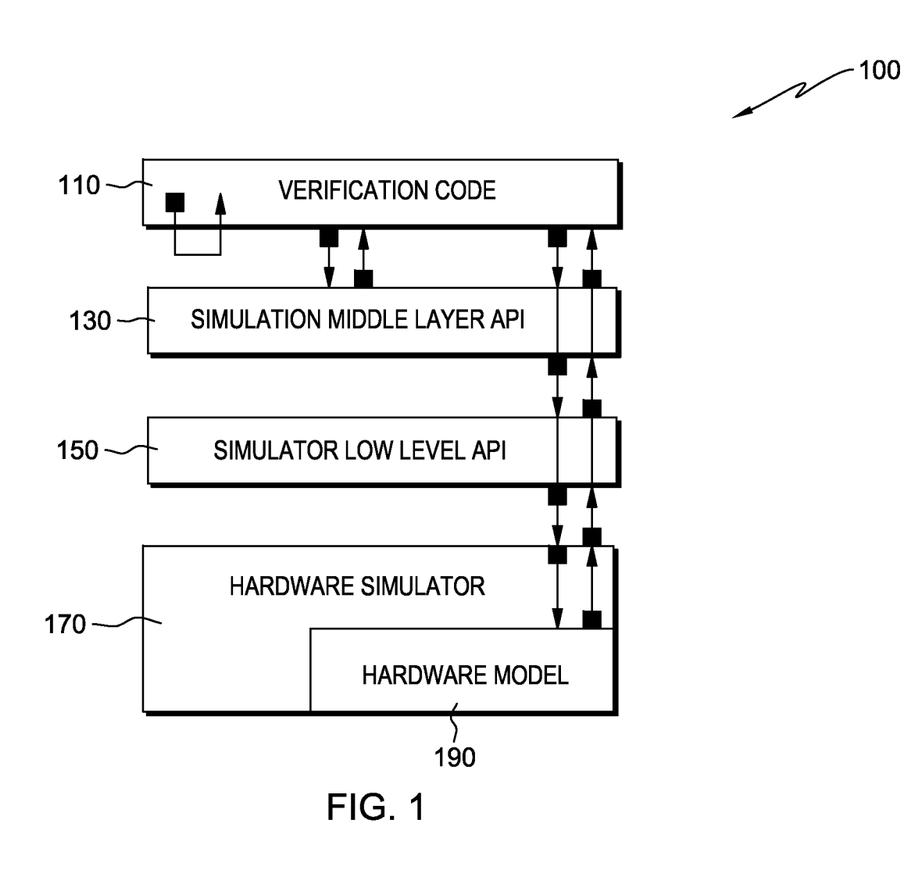
FIG. 1 is a diagram illustrating a simulation environment including multiple layers, in accordance with an exemplary embodiment of the present invention.
Figures 1A, 5:
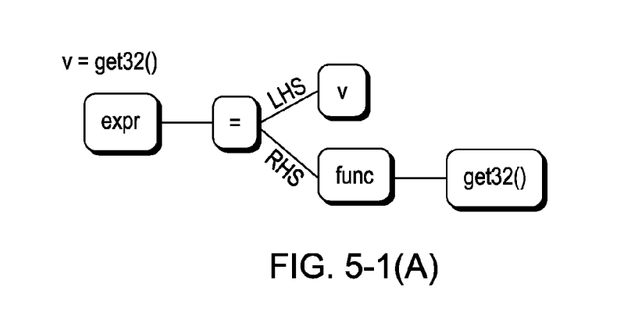
Figures 1B, 5:
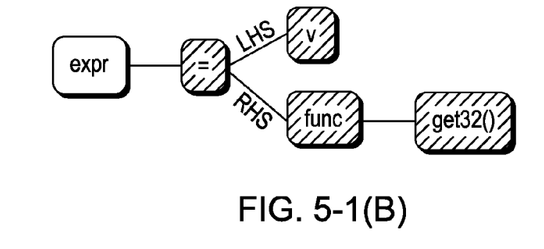

FIG. 1 is a diagram illustrating simulation environment 100 including multiple layers, in accordance with an exemplary embodiment of the present invention. Simulation environment 100 includes verification code 110, simulation middle layer API 130, simulator low level API 150, hardware simulator 170, and hardware model 190. Verification code 110 is written by a user to verify hardware model 190. Verification code 110 is the code (e.g. written in C, C++, Java, etc.) which can be modified by a user. Simulation middle layer API 130 is a high level abstraction of simulator low level API 150. In the exemplary embodiment, verification code 110 and simulation middle layer API 130 use a same programming language (e.g. C++). In other embodiments, verification code 110 and simulation middle layer API 130 may respectively use different languages. Simulator low level API 150 is a programming language interface of hardware simulator 170. Simulator low level API 150 is usually an API written in a common programming language (e.g. C). Hardware simulator 170 is a software component that simulates hardware model 190. Hardware model 190 is based on compiled Hardware Description Language (HDL) which is a language describing the hardware.

Referring to FIG. 1, verification code 110 calls functions implemented within verification code 110. Verification code 110 calls functions in simulation middle layer API 130. There are function calls from verification code 110 through simulation middle layer API 130 to all other layers, namely simulator low level API 150, hardware simulator 170, and hardware model 190. The present invention is to identify improvement points in the source code of verification code 110 so as to avoid unnecessary function calls from verification code 110 through simulation middle layer API 130 to the all other layers. Therefore, the present invention provides a method, computer program product, and computer system for improving efficiency of simulating a hardware system.

Figure 2:
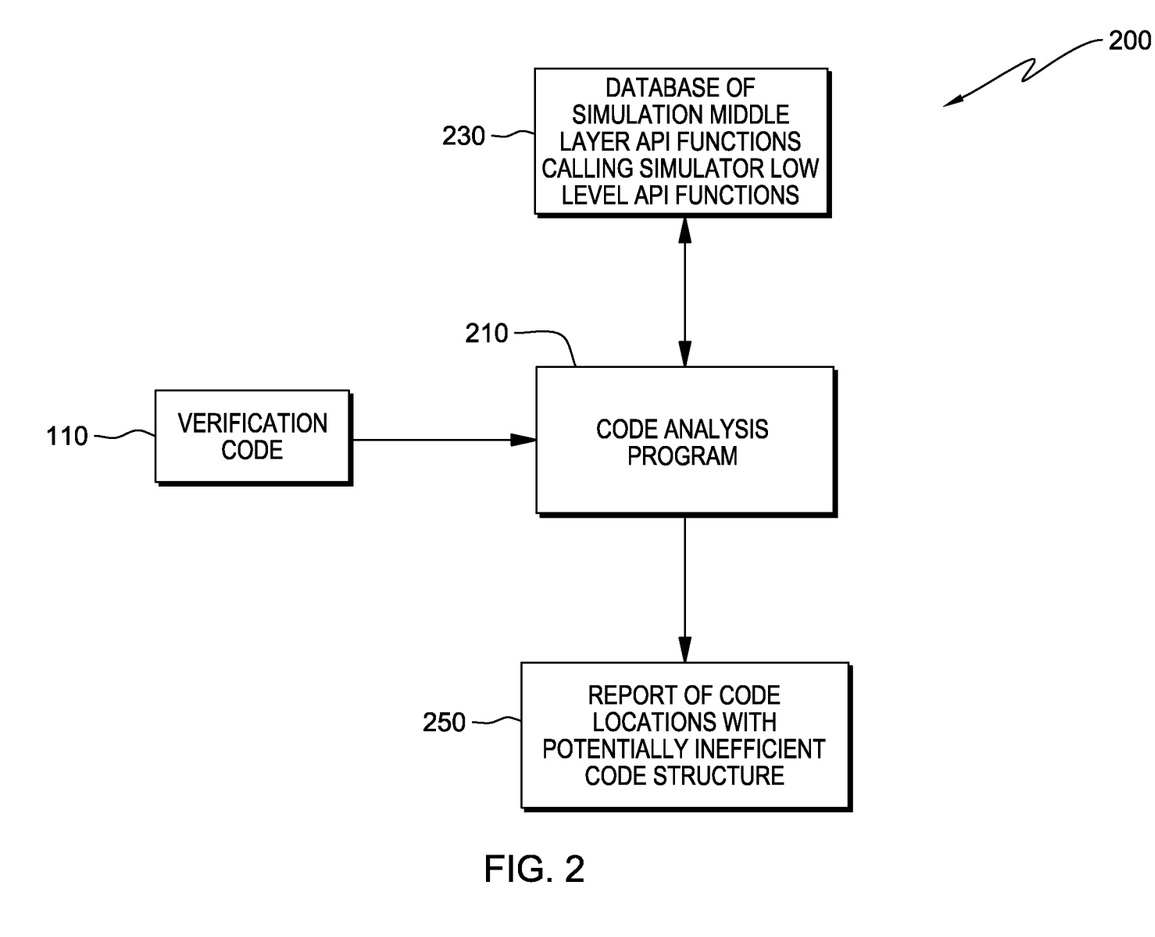
FIG. 2 is a diagram showing a system for code analysis for improving efficiency of the verification code in the simulation environment shown in FIG. 1, in accordance with an exemplary embodiment of the present invention.
Figures 2A, 5:
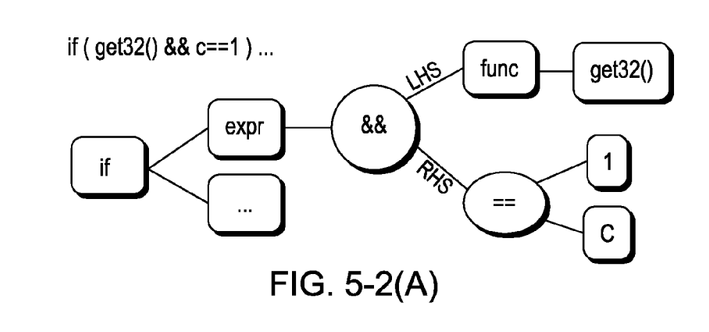
Figures 2B, 5:
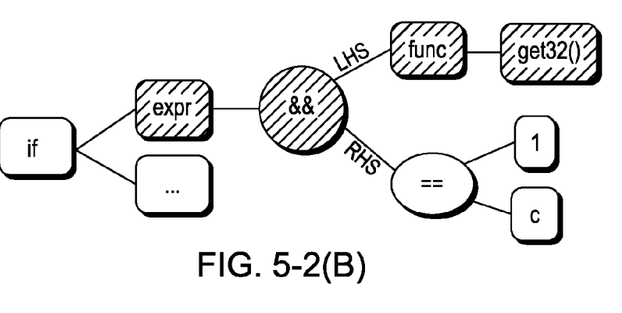

FIG. 2 is a diagram showing system 200 for code analysis for improving efficiency of verification code 110 in simulation environment 100 shown in FIG. 1, in accordance with an exemplary embodiment of the present invention. System 200 includes code analysis program 210, verification code 110, database 230 of simulation middle layer API functions calling low level API functions, and report 250 of code locations of potentially inefficient code structure in verification code 110. Code analysis program 210 identifies calling functions in simulation middle layer API 130; the calling functions call functions of simulator low level API 150 and thus interact with hardware simulator 170 and hardware model 190 shown in FIG. 1. Code analysis program 210 adds information of the calling functions to database 230. To identify improvement points in the source code of verification code 110 in simulation environment 100, code analysis program 210 analyzes the source code of verification code 110. In analyzing the source code, code analysis program 210 retrieves the information on database 230. Code analysis program 210 provides report 250 which includes information on code locations of potentially inefficient code structure in verification code 110, after identifying the improvement points in the source code of verification code 110. Code analysis program 210 is discussed in great detail in later paragraphs with reference to FIGS. 3-8.

Figure 3:
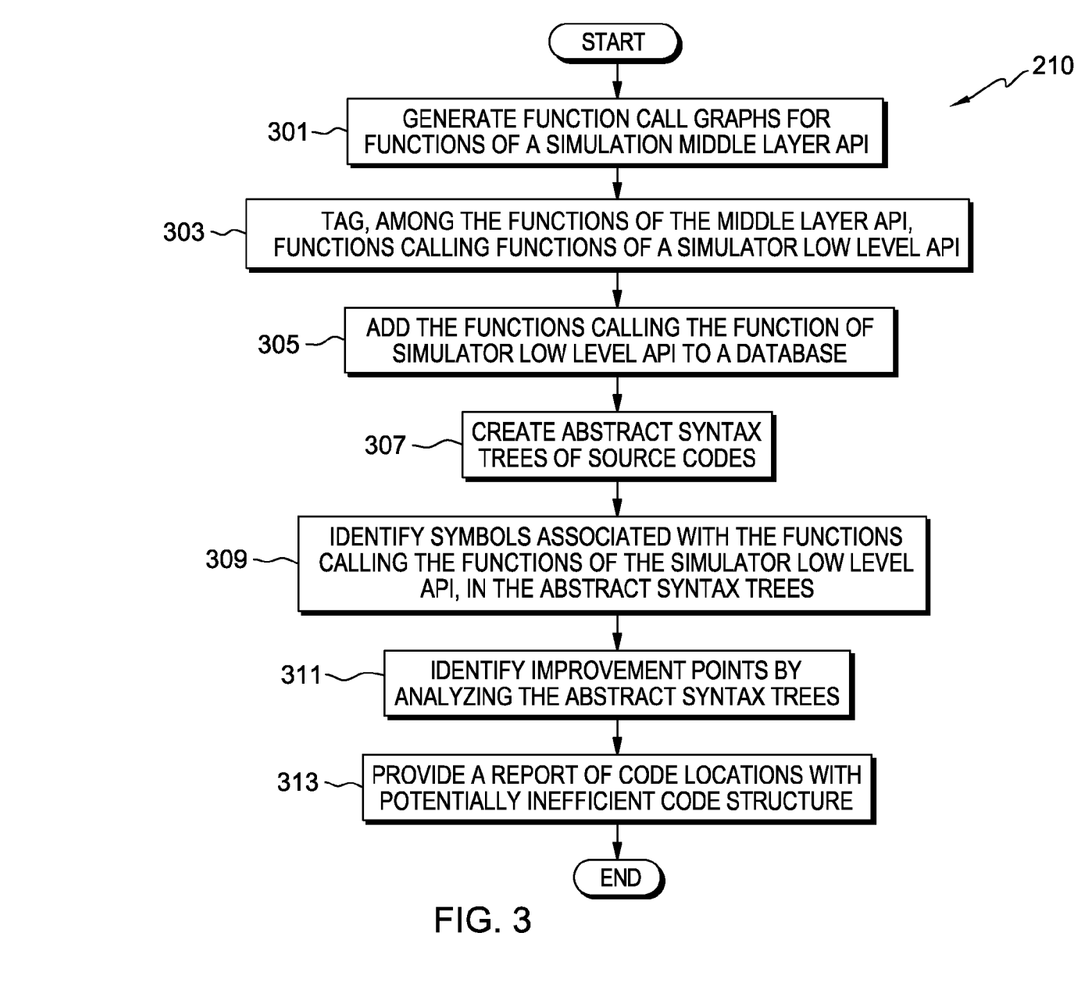
FIG. 3 is a flowchart illustrating operational steps of a code analysis program shown in FIG. 2, in accordance with an exemplary embodiment of the present invention.
Figures 3A, 5:
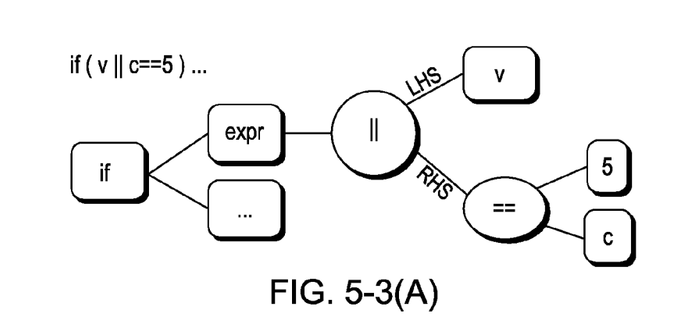
Figures 3B, 5:
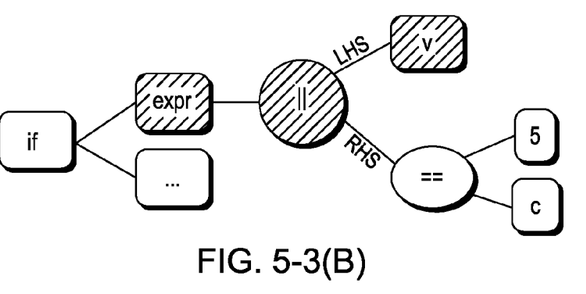
Figure 41:
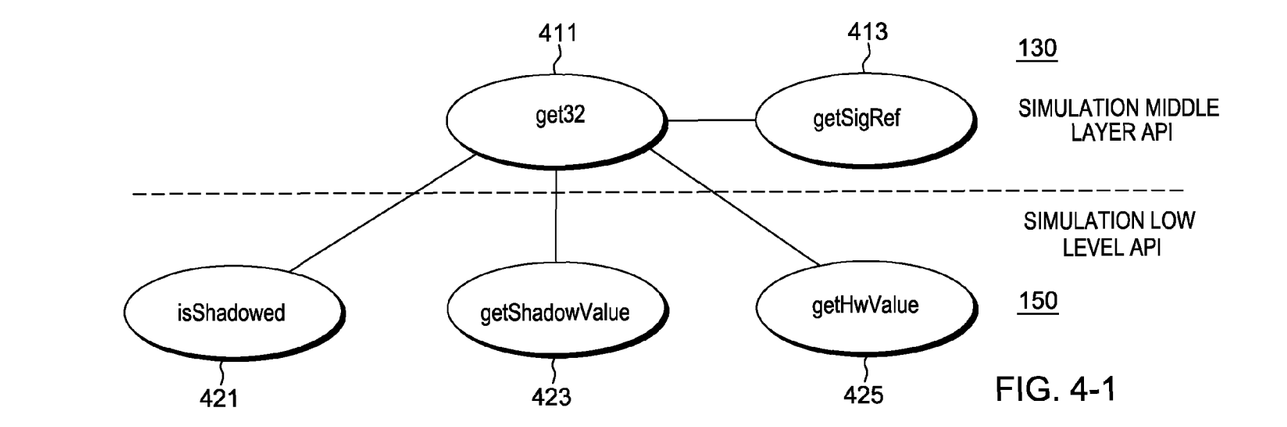

FIG. 3 is a flowchart illustrating operational steps of code analysis program 210 shown in FIG. 2, in accordance with an exemplary embodiment of the present invention. The purpose of steps 301 and 303 shown in FIG. 3 is to identify, among functions of simulation middle layer API 130 in simulation environment 100 shown in FIG. 1, functions calling functions of simulator low level API 150 in simulation environment 100 shown in FIG. 1. At step 301, code analysis program 210 generates function call graphs of simulation middle layer API 130. Based on the header files of simulation middle layer API 130, code analysis program 210 generates the function call graphs. FIG. 4-1 shows an example of one of the function call graphs. In FIG. 4-1, functions of simulation middle layer API 130 include function get32 411 and function getSigRef 413; functions of simulator low level API 150 include function is Shadowed 421, function getShadowValue 423, and function getHwValue 425. In the example, function get32 411 of simulation middle layer API 130 calls the three functions of simulator low level API 150, and also calls function getSigRef 413 of simulation middle layer API 130.

Figure 42:
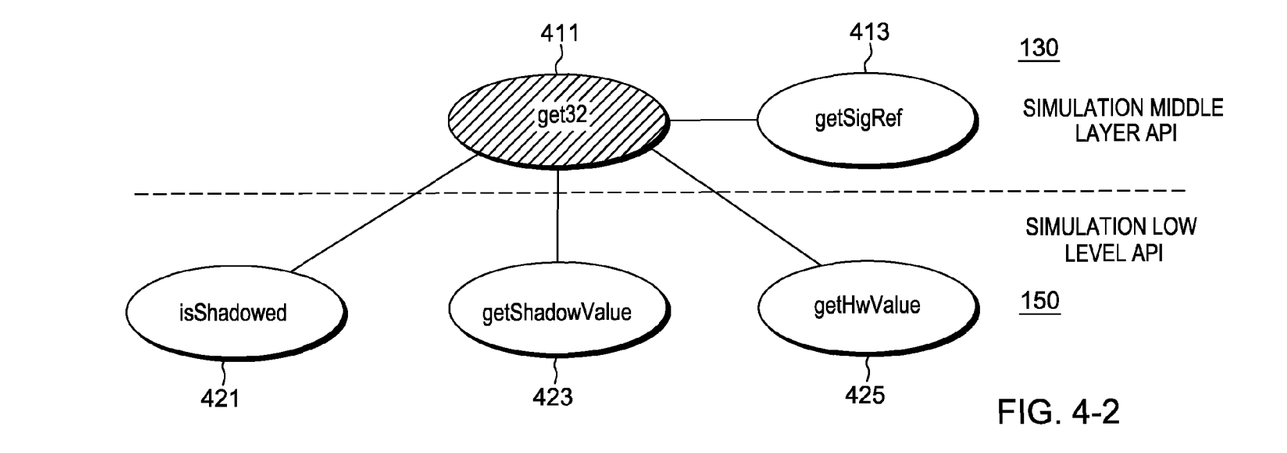

At step 303, code analysis program 210 tags the functions calling the functions of simulator low level API 150. FIG. 4-2 indicates that, by highlighting with hatching, the functions calling the functions of simulator low level API 150 is tagged. In this example, function get32 411 is tagged because it calls function is Shadowed 421, function getShadowValue 423, and function getHwValue 425 of simulator low level API 150. At step 305, code analysis program 210 adds information about the functions calling the functions of simulator low level API 150 to database 230.

At step 307, code analysis program 210 creates abstract syntax trees of source code of verification code 110. An abstract syntax tree is a tree representation of the abstract syntactic structure of source code written in a programming language. Each node of the abstract syntax tree denotes a construct occurring in the source code. For each function in verification code 110, code analysis program 210 creates an abstract syntax tree. Therefore, a plurality of the abstract syntax trees is generated for verification code 110. FIGS. 5-1(A), 5-2(A), and 5-3(A) show exemplary segments of the abstract syntax trees. FIG. 5-1(A) shows an assignment "v=get32( )" in the abstract syntax trees, FIG. 5-2(A) shows an expression "if (get32( ) && c==1) . . . " in the abstract syntax trees, and FIG. 5-3(A) shows an expression "if v‖c==5) . . . " in the abstract syntax trees.

At step 309, code analysis program 210 identifies, in the abstract syntax trees, symbols associated with the functions calling the functions of simulator low level API 150. Step 309 is described in great detail in later paragraphs with reference to FIG. 6.

At step 311, code analysis program 210, by analyzing the abstract syntax trees, identifies improvement points in the source code of verification code 110. Step 311 is described in great detail in later paragraphs with reference to FIG. 7. At step 313, code analysis program 210 provides report 250 of code locations of potentially inefficient code structure in verification code 110.

Figure 6:
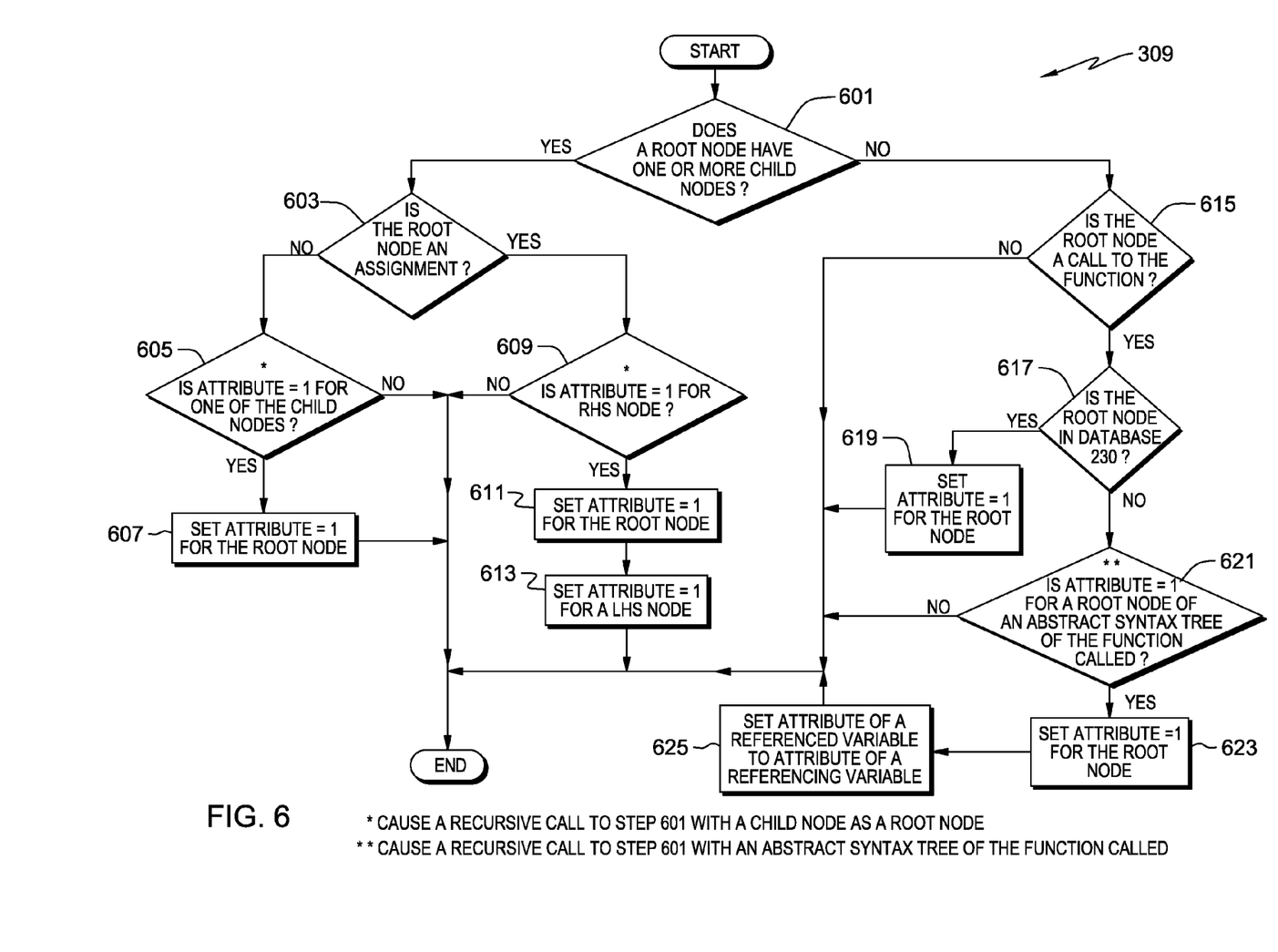
FIG. 6 is a flowchart illustrating operational steps of identifying, in abstract syntax trees of source code of the verification code in the simulation environment shown in FIG. 1, symbols associated with simulation middle layer functions calling simulator low level API functions, in accordance with an exemplary embodiment of the present invention.

FIG. 6 is a flowchart illustrating operational steps of identifying, in abstract syntax trees of source code of verification code 110 in simulation environment 100 shown in FIG. 1, symbols associated with simulation middle layer functions calling simulator low level API functions, in accordance with an exemplary embodiment of the present invention. While FIG. 3 includes step 309 at which code analysis program 210 identifies symbols associated with simulation middle layer functions calling simulator low level API functions, FIG. 6 presents detailed operational steps of step 309 in FIG. 3. In the exemplary embodiment, the operational steps presented in FIG. 6 are implemented by code analysis program 210.

An abstract syntax tree has a plurality of nodes, and each of the nodes has an attribute. In the exemplary embodiment, for a node that is a symbol associated with simulation middle layer functions calling simulator low level API functions, code analysis program 210 sets the attribute to 1; for a node that is not a symbol associated with simulation middle layer functions calling simulator low level API functions, code analysis program 210 sets the attribute to 0. In analyzing the abstract syntax tree in the exemplary embodiment, code analysis program 210 sets initial attributes for the respective nodes to 0. In the exemplary embodiment, analyzing the abstract syntax tree is started with a root node thereof.

Referring to FIG. 6, at step 601 (a decision block), code analysis program 210 determines whether a root node in an abstract syntax tree (a first abstract syntax tree) has one or more child nodes. In response to determining that the root node of the abstract syntax tree has one or more child nodes (YES branch of step 601), at step 603 (a decision block), code analysis program 210 determines whether the root node is an assignment. In response to determining that the root node is not an assignment (NO branch of step 603), at step 605, code analysis program 210 determines whether the attribute of one of the one or more child nodes is equal to 1. At step 605, code analysis program 210 makes a recursive call to step 601 for each of the one or more child nodes after setting the each of the one or more child nodes as the root node. In response to determining that the attribute of one of the one or more child nodes is equal to 1 (YES branch of step 605), at step 607, code analysis program 210 sets the attribute of the root node to 1.

Referring to FIG. 6, in response to determining that the root node is an assignment (YES branch of step 603), at step 609 (a decision block), code analysis program 210 determines whether the attribute of a right hand side (RHS) node of the assignment is equal to 1. At step 609, code analysis program 210 makes a recursive call to step 601 for each of one or more child nodes of the right hand side (RHS) node after setting the each of the one or more child nodes of the right hand side (RHS) node as the root node. In response to determining that the attribute of the right hand side (RHS) node of the assignment is equal to 1 (YES branch of step 609), at step 611, code analysis program 210 sets the attribute of the root node to 1. And, next at step 613, code analysis program 210 sets the attribute of a left hand side (LHS) node of the assignment to 1.

Referring to FIG. 6, in response to determining that the root node does not have the one or more child nodes (NO branch of step 601), at step 615 (a decision block), code analysis program 210 determines whether the root node is a call to a called function. In response to determining that the root node is a call to a called function (YES branch of step 615), at step 617 (a decision block), code analysis program 210 determines whether the root node is in database 230. In response to determining that the root node is in database 230 (YES branch of step 617), code analysis program 210, at step 619 sets the attribute of the root node to 1. In response to determining that the root node is not in database 230 (NO branch of step 617), at step 621 (a decision block), code analysis program 210 determines whether the attribute of a root node of an abstract syntax tree of the called function (a second abstract syntax tree) is equal to 1. At step 621, code analysis program 210 makes a recursive call to step 601 for the abstract syntax tree of the called function. In response to determining that the attribute of the root node of the abstract syntax tree of the called function (the root node of the second abstract syntax tree) is equal to 1 (YES branch of step 621), at step 623, code analysis program 210 sets the attribute of the root node of the first abstract syntax tree to 1. At step 625, code analysis program 210 sets the attribute of a referenced variable in the first abstract syntax tree to the attribute of a referencing variable in the second abstract syntax tree. If the attribute of the referencing variable in the abstract syntax tree of the called function (the second abstract syntax tree) is equal to 1, then the attribute of the referenced variable corresponding to the referencing variable is set to 1.

To present examples of the operational steps shown in FIG. 6, FIGS. 5-1(B), 5-2(B) and 5-3(B) show examples of identifying, in the exemplary segments of abstract syntax trees shown in FIGS. 5-1(A), 5-2(A), and 5-3(A), the symbols associated with simulation middle layer functions calling simulator low level API functions, in accordance with an exemplary embodiment of the present invention. In FIG. 5-1(A), node "get32( )" is a node without child nodes, and it is a function in simulation middle layer API 130 and calls simulator low level API 150. Code analysis program 210 identifies node "get32( )" to be one of the symbols, according to steps 601, 615, 617, and 619. In FIG. 5-1(A), node "func" has a child node-node "get32( )". Code analysis program 210 identifies node "func" to be one of the symbols and sets its attribute to 1, according to steps 601, 603, 605, and 607. In FIG. 5-1(A), node "=" is an assignment. Code analysis program 210 identifies node "=" to be one of the symbols and sets its attribute to 1, according to steps 601, 603, 609, and 611; then, code analysis program 210 identifies left-hand-side (LHS) node "v" to be one of the symbols and sets its attribute to 1 at step 613. All nodes identified to be the symbols (attributes equal to 1) are highlighted by hatching in FIG. 5-1(B).

Code analysis program 210 identifies nodes "get32( )" and "func" in FIG. 5-2(A) to be the symbols which are highlighted by hatching in FIG. 5-2(B). Code analysis program 210 identifies node "&&" in 5-2(A) to be one of the symbols and sets the attribute to 1, according to steps 601, 603, 605, and 607. In 5-2(B), node "&&" is highlighted by hatching. Code analysis program 210 identifies node "expr" in 5-2(A) to be one of the symbols and sets the attribute to 1, according to steps 601, 603, 605, and 607. In 5-2(B), node "expr" is highlighted by hatching.

In FIG. 5-3(A), node "v" is a node without any child nodes. Code analysis program 210 identifies node "v" in 5-3(A) to be one of the symbols and sets the attribute to 1, according to steps 601, 615, 617, 621, 623, and 625. In analyzing node "v", code analysis program 210 makes a recursive call with the abstract syntax tree of node "v" shown in FIG. 5-1(A). Code analysis program 210 identifies respectively nodes "||" and "expr" in 5-3(A) to be the symbols and sets their attributes to 1, according to steps 601, 603, 605, and 607. Nodes "v", "||", and "expr" (attributes equal to 1) are highlighted by hatching in FIG. 5-3(B).

Figure 7:
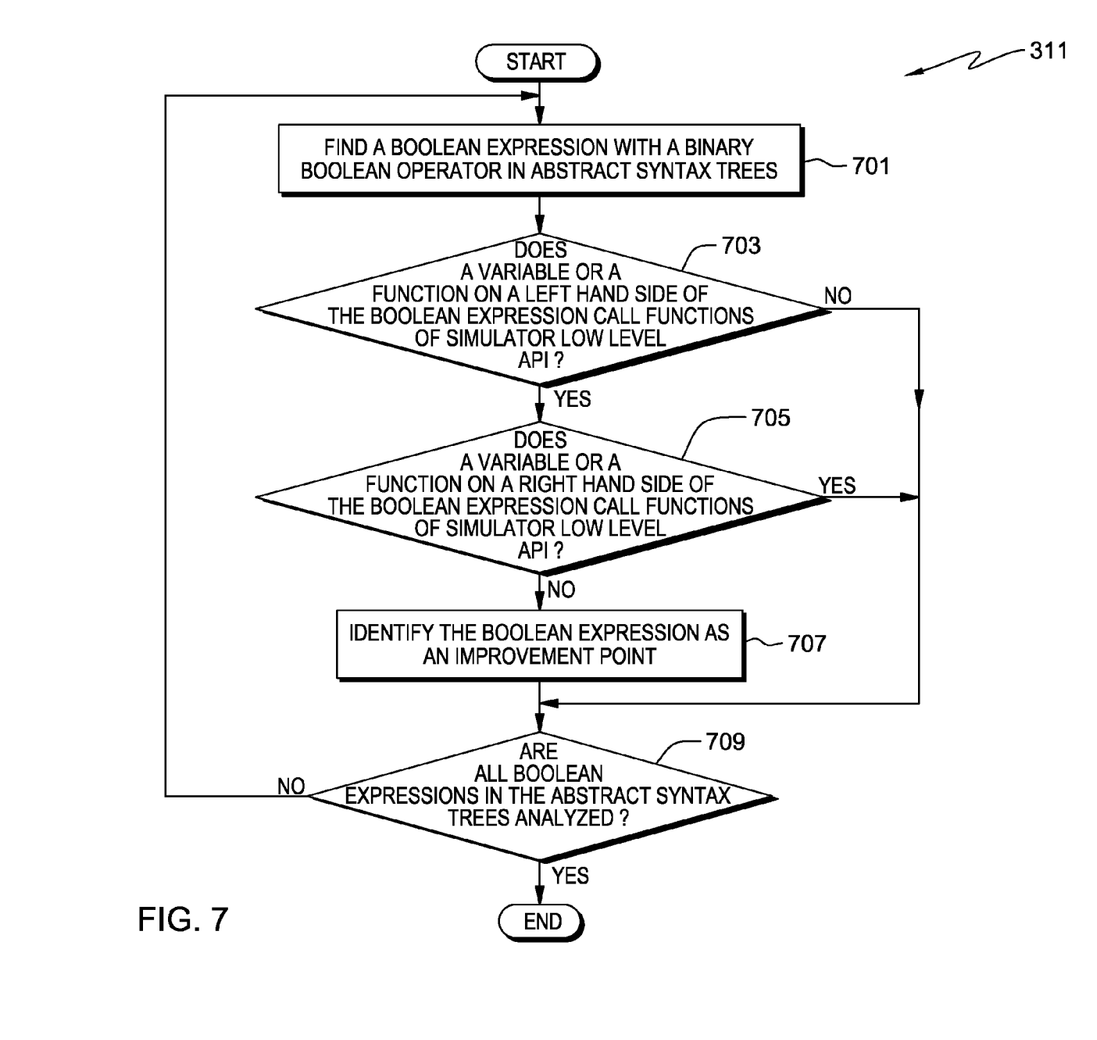
FIG. 7 is a flowchart illustrating operational steps of identifying improvement points in source code of the verification code in the simulation environment shown in FIG. 1, in accordance with an exemplary embodiment of the present invention.

FIG. 7 is a flowchart illustrating operational steps of identifying improvement points in source code of verification code 110 in simulation environment 100 shown in FIG. 1, in accordance with an exemplary embodiment of the present invention. While FIG. 3 includes step 311 at which code analysis program 210 identifies the improvement points in source code of verification code 110, FIG. 7 presents detailed operational steps of step 311 in FIG. 3. In the exemplary embodiment, the operational steps presented in FIG. 7 are implemented by code analysis program 210.

Referring to FIG. 7, at step 701, code analysis program 210 finds a Boolean expression with a binary Boolean operator in abstract syntax trees. FIGS. 5-2(A) and 5-3(A) show examples of the Boolean expression with a binary Boolean operator. At step 703 (a decision block), code analysis program 210 determines whether a variable or a function on the left-hand-side (LHS) of the Boolean expression calls functions of simulator low level API 150 through calling functions in simulation middle layer API 130.

In response to determining that the variable or the function on the left-hand-side (LHS) of the Boolean expression calls the functions of simulator low level API 150 through calling functions in simulation middle layer API 130 (YES branch of step 703), at step 705 (a decision block), code analysis program 210 determines whether a variable or a function on the right-hand-side (RHS) of the Boolean expression calls functions of simulator low level API 150 through calling functions in simulation middle layer API 130.

In response to determining that the variable or the function on the left-hand-side (LHS) of the Boolean expression does not call functions of simulator low level API 150 through calling functions in simulation middle layer API 130 (NO branch of step 703), code analysis program 210 moves to step 709 which is discussed in a later paragraph. If the variable or the function on the left-hand-side (LHS) of the Boolean expression does not call functions of simulator low level API 150 through calling functions in simulation middle layer API 130, the Boolean expression is not an improvement point.

In response to determining that the variable or the function on the right-hand-side (RHS) of the Boolean expression does not call functions of simulator low level API 150 through calling functions in simulation middle layer API 130 (NO branch of step 705), at step 707, code analysis program 210 identifies the Boolean expression to be an improvement point.

In response to determining that the variable or the function on the right-hand-side (RHS) of the Boolean expression calls functions of simulator low level API 150 through calling functions in simulation middle layer API 130 (YES branch of step 705), code analysis program 210 moves to step 709 which is discussed in a later paragraph. If the variable or the function on the right-hand-side (RHS) of the Boolean expression calls simulator low level API 150 through calling functions in simulation middle layer API 130, the Boolean expression is not an improvement point.

After step 707, or after determining that the variable or the function on the left-hand-side (LHS) of the Boolean expression does not call simulator low level API 150 through calling functions in simulation middle layer API 130 (NO branch of step 703), or after determining that the variable or the function on the right-hand-side (RHS) of the Boolean expression calls simulator low level API 150 through calling functions in simulation middle layer API 130 (YES branch of step 705), code analysis program 210, at step 709 (a decision block), determines whether all Boolean expressions in the abstract syntax trees are analyzed. In response to determining that the all Boolean expressions in the abstract syntax trees are analyzed (YES branch of step 709), code analysis program 210 terminates its operation. In response to determining that not all Boolean expressions in the abstract syntax trees are analyzed (NO branch of step 709), code analysis program 210 goes back to step 701.

For example, the variable or the function on the left-side-hand (LHS) of the Boolean expression shown in FIG. 5-2(A) or 5-3(A) calls the functions of simulator low level API 150 through calling functions in simulation middle layer API 130, as shown in FIG. 5-2(B) or 5-3(B); the variable or the function on the right-side-hand (RHS) of the Boolean expression shown in FIG. 5-2(A) or 5-3(A) does not call simulator low level API 150 through calling functions in simulation middle layer API 130, as shown in FIG. 5-2(B) or 5-3(B). Therefore, code analysis program 210 will identify that Boolean expressions shown in FIGS. 5-2(A) and 5-3(A) are improvement points in source code of verification code 110.

Figure 8:
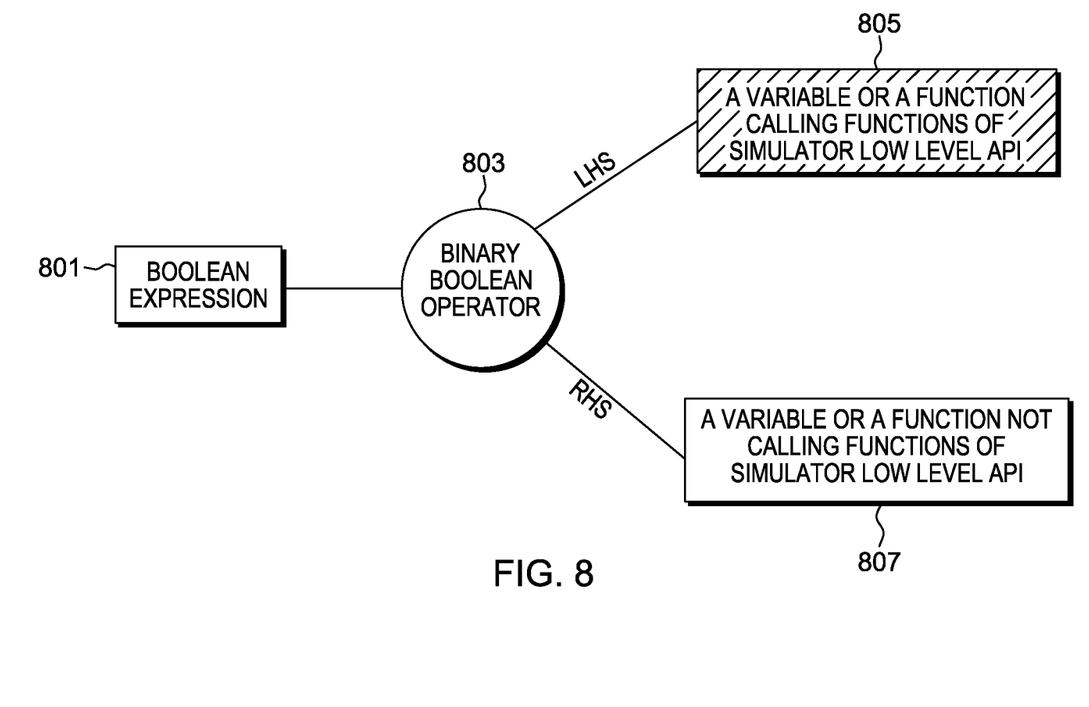
FIG. 8 is a diagram showing that a Boolean expression in an exemplary segment of an abstract syntax tree is identified as an improvement point, in accordance with an exemplary embodiment of the present invention.

FIG. 8 is a diagram showing that a Boolean expression in an exemplary segment of an abstract syntax tree is identified as an improvement point, in accordance with an exemplary embodiment of the present invention. The exemplary segment of the abstract syntax tree has node "Boolean expression" 801, node "binary Boolean operator" 803, LHS node 805, and RHS node 807. In the exemplary segment of the abstract syntax tree, LHS node 805 has been identified as a variable or a function that calls functions of simulator low level API 150 through calling functions in simulation middle layer API 130. LHS node 805 in FIG. 8 is highlighted by hatching. However, RHS node 807 has been identified as a variable or a function that does not call functions of simulator low level API 150 through calling functions in simulation middle layer API 130. FIG. 8 shows two conditions for identifying the Boolean expression: first, LHS node 805 is identified as a variable or a function that calls functions of simulator low level API 150 through calling functions in simulation middle layer API 130; second, RHS node 807 is identified as a variable or a function that does not call functions of simulator low level API 150 through calling functions in simulation middle layer API 130. In response to determining that both conditions are true, code analysis program 210 identifies the Boolean expression to be an improvement point. The location of the Boolean expression is potentially inefficient code structure in the source code of verification code 110. Based on the information of the improvement point identified by code analysis program 210, the source code of verification code 110 can be modified such that unnecessary function calls from verification code 110 through simulation middle layer API 130 to all other layers (namely, simulator low level API 150, hardware simulator 170, and hardware model 190) are avoided. The modification of the source code can be done by reordering operands in the Boolean expression.

Figure 9:
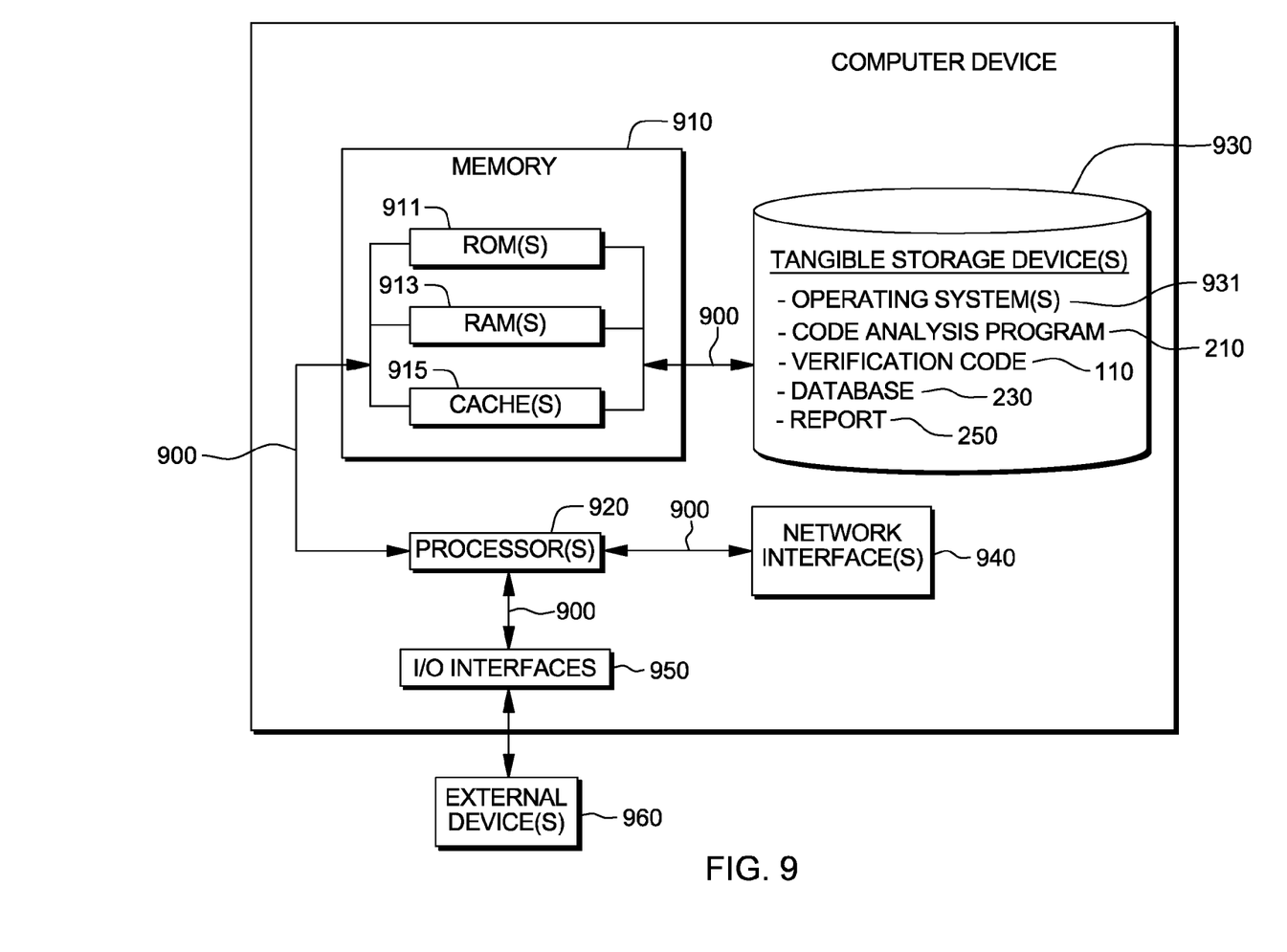
FIG. 9 is a diagram of components of a computer device hosting a system (shown in FIG. 2) for code analysis for improving efficiency of the verification code of the simulation environment (shown in FIG. 1), in accordance with an exemplary embodiment of the present invention.

FIG. 9 is a diagram of components of a computer device hosting system 200 (shown in FIG. 2) for code analysis for improving efficiency of verification code 110 of simulation environment 100, in accordance with an exemplary embodiment of the present invention. It should be appreciated that FIG. 9 provides only an illustration of one implementation and does not imply any limitations with regard to the environment in which different embodiments may be implemented.

Referring to FIG. 9, the computer device includes communications fabric 900 which provides communications among processor(s) 920, memory 910, tangible storage device(s) 930, network interface(s) 940, and I/O (input/output) interface(s) 950. Memory 910 includes ROM(s) (Read Only Memory) 911, RAM(s) (Random Access Memory) 913, and cache(s) 915.

One or more operating system(s) 931 resides on one or more computer-readable tangible storage device(s) 930. In the exemplary embodiment, code analysis program 210, database 230, and report 250 resides on one or more computer-readable tangible storage device(s) 930 of the computer device. In the exemplary embodiment, verification code 110 is loaded onto one or more computer-readable tangible storage device(s) 930 of the computer device.

The computer device further includes I/O interface(s) 950. I/O interface(s) 950 allow for input and output of data with external device(s) 960 that may be connected to the computer device. The computer device further includes network interface(s) 940 for communications between the computer device and a computer network.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer program product for analyzing code to improve efficiency of simulating a hardware system, the computer program product comprising:
   one or more computer-readable tangible storage devices and program instructions stored on at least one of the one or more computer-readable tangible storage devices, the program instructions comprising:
   program instructions to identify one or more functions calling an application programming interface (API) of a hardware simulator simulating the hardware system; and
   program instructions to identify respective one or more Boolean expressions as one or more improvement points in source code for verifying a hardware model of the hardware system, in response to determining that left hand sides of the respective one or more Boolean expressions are associated with the one or more functions calling the application programming interface and in response to determining that right hand sides of the respective one or more Boolean expressions are not associated with the one or more functions calling the application programming interface.

2. The computer program product of claim 1, further comprising:
   program instructions to generate abstract syntax trees of the source code for verifying the hardware model of the hardware system;
   program instructions to identify, in the abstract syntax trees, one or more symbols associated with the one or more functions calling the application programming interface; and
   program instructions to identify, in the abstract syntax trees, one or more Boolean expressions each with a binary Boolean operator.

3. The computer program product of claim 1, further comprising:
   program instructions to analyze header files of a high level abstraction of the application programming interface;
   program instructions to generate one or more function call graphs for the high level abstraction of the application programming interface;
   program instructions to tag, in the one or more function call graphs, the one or more functions calling the application programming interface; and
   program instructions to add to a database the one or more functions calling the application programming interface.

4. The computer program product of claim 1, further comprising:
   program instructions to provide a report on the one or more improvement points in the source code.

5. The computer program product of claim 1, the computer program product further comprising program instructions for identifying a symbol in an abstract syntax tree of the source code, wherein the symbol is a method or a variable associated with the one or more functions calling the application programming interface, the program instructions for identifying the symbol comprising:

program instructions to determine whether a root node of a first abstract syntax tree has one or more child nodes;

program instructions to determine whether the root node is an assignment, in response to determining that the root node has the one or more child nodes;

program instructions to determine, in response to determining that the root node is not the assignment, whether one of the one or more child nodes is the symbol, wherein a recursive call to the program instructions for identifying the symbol is made for each of the one or more child nodes after setting the each of the one or more child nodes as the root node;

program instructions to determine the root node is the symbol, in response to determining that the one of the one or more child nodes is the symbol;

program instructions to determine, in response to determining that the root node is the assignment, whether a right hand side node of the assignment is the symbol, wherein a recursive call to the program instructions for identifying the symbol is made for each of one or more child nodes of the right hand side node after setting the each of the one or more child nodes of the right hand side node as the root node;

program instructions to determine the root node is the symbol, in response to determining that the right hand side node of the assignment is the symbol; and program instructions to determine a left hand side node of the assignment is the symbol, in response to determining that the right hand side node of the assignment is the symbol.

6. The computer program product of claim 5, the program instructions for identifying the symbol further comprising:

program instructions to determine whether the root node of the first abstract syntax tree is a call to a called function, in response to determining that the root node of the first abstract syntax tree does not have the one or more child nodes;

program instructions to determine whether the root node of the first abstract syntax tree is included in a database of the one or more functions calling the application programming interface, in response to determining that the root node of the first abstract syntax tree is the call to the called function;

program instructions to determine the root node of the first abstract syntax tree is the symbol, in response to determining that the root node of the first abstract syntax tree is included in the database;

program instructions to determine, in response to determining that the root node of the first abstract syntax tree is not included in the database, whether a root node of a second abstract syntax tree that includes the called function is the symbol, wherein a recursive call to the steps for identifying the symbol is made for the second abstract syntax tree; and program instructions to determine that the root node of the first abstract syntax tree is the symbol, in response to determining that the root node of the second abstract syntax tree that includes the called function is the symbol.

7. A computer system for analyzing code to improve efficiency of simulating a hardware system, the computer system comprising:

one or more processors, one or more computer-readable tangible storage devices, and program instructions stored on at least one of the one or more computer-readable tangible storage devices for execution by at least one of the one or more processors, the program instructions comprising:

program instructions to identify one or more functions calling an application programming interface (API) of a hardware simulator simulating the hardware system; and program instructions to identify respective one or more Boolean expressions as one or more improvement points in source code for verifying a hardware model of the hardware system, in response to determining that left hand sides of the respective one or more Boolean expressions are associated with the one or more functions calling the application programming interface and in response to determining that right hand sides of the respective one or more Boolean expressions are not associated with the one or more functions calling the application programming interface.

8. The computer system of claim 7, further comprising:

program instructions to generate abstract syntax trees of the source code for verifying the hardware model of the hardware system;

program instructions to identify, in the abstract syntax trees, one or more symbols associated with the one or more functions calling the application programming interface; and program instructions to identify, in the abstract syntax trees, one or more Boolean expressions each with a binary Boolean operator.

9. The computer system of claim 7, further comprising:

program instructions to analyze header files of a high level abstraction of the application programming interface;

program instructions to generate one or more function call graphs for the high level abstraction of the application programming interface;

program instructions to tag, in the one or more function call graphs, the one or more functions calling the application programming interface; and program instructions to add to a database the one or more functions calling the application programming interface.

10. The computer system of claim 7, further comprising:

program instructions to provide a report on the one or more improvement points in the source code.

11. The computer system of claim 7, further comprising program instructions for identifying a symbol in an abstract syntax tree of the source code, wherein the symbol is a method or a variable associated with the one or more functions calling the application programming interface, the program instructions for identifying the symbol comprising:

program instructions to determine whether a root node of a first abstract syntax tree has one or more child nodes;

program instructions to determine whether the root node is an assignment, in response to determining that the root node has the one or more child nodes;

program instructions to determine, in response to determining that the root node is not the assignment, whether one of the one or more child nodes is the symbol, wherein a recursive call to the program instructions for identifying the symbol is made for each of the one or more child nodes after setting the each of the one or more child nodes as the root node;

program instructions to determine the root node is the symbol, in response to determining that the one of the one or more child nodes is the symbol;

program instructions to determine, in response to determining that the root node is the assignment, whether a right hand side node of the assignment is the symbol, wherein a recursive call to the program instructions for identifying the symbol is made for each of one or more child nodes of the right hand side node after setting the each of the one or more child nodes of the right hand side node as the root node;

program instructions to determine the root node is the symbol, in response to determining that the right hand side node of the assignment is the symbol; and program instructions to determine a left hand side node of the assignment is the symbol, in response to determining that the right hand side node of the assignment is the symbol.

12. The computer system of claim 11, the program instructions for identifying the symbol further comprising:

program instructions to determine whether the root node of the first abstract syntax tree is a call to a called function, in response to determining that the root node of the first abstract syntax tree does not have the one or more child nodes;

program instructions to determine whether the root node of the first abstract syntax tree is included in a database the one or more functions calling the application programming interface, in response to determining that the root node of the first abstract syntax tree is the call to the called function;

program instructions to determine the root node of the first abstract syntax tree is the symbol, in response to determining that the root node of the first abstract syntax tree is included in the database;

program instructions to determine, in response to determining that the root node of the first abstract syntax tree is not included in the database, whether a root node of a second abstract syntax tree that includes the called function is the symbol, wherein a recursive call to the steps for identifying the symbol is made for the second abstract syntax tree; and program instructions to determine that the root node of the first abstract syntax tree is the symbol, in response to determining that the root node of the second abstract syntax tree that includes the called function is the symbol.

* * * * *